US009756766B2

United States Patent
Best (10) Patent No.: US 9,756,766 B2
(45) Date of Patent: Sep. 5, 2017

(54) SYSTEM AND METHOD FOR AIR-COOLING HARD DRIVES IN LIQUID-COOLED SERVER RACK

(71) Applicant: Green Revolution Cooling, Inc., Austin, TX (US)

(72) Inventor: Christiaan Scott Best, Austin, TX (US)

(73) Assignee: GREEN REVOLUTION COOLING, INC., Austin, TX (US)

( * ) Notice: Subject to any disclaimer, the term of this patent is extended or adjusted under 35 U.S.C. 154(b) by 13 days.

(21) Appl. No.: 14/711,523

(22) Filed: May 13, 2015

(65) Prior Publication Data
US 2015/0334880 A1 Nov. 19, 2015

Related U.S. Application Data

(60) Provisional application No. 61/996,608, filed on May 13, 2014.

(51) Int. Cl.
*H05K 7/20* (2006.01)
(52) U.S. Cl.
CPC ..... *H05K 7/20763* (2013.01); *H05K 7/20145* (2013.01); *H05K 7/20236* (2013.01);
(Continued)
(58) Field of Classification Search
CPC ........... H05K 7/20763; H05K 7/20781; H05K 7/20236; H05K 7/20718; H05K 7/20145; H05K 7/20836
(Continued)

(56) References Cited

U.S. PATENT DOCUMENTS

| 3,600,636 A | 8/1971 | Petersen |
| 3,858,090 A | 12/1974 | Lehmann |

(Continued)

FOREIGN PATENT DOCUMENTS

| CN | 101443724 A | 5/2009 |
| JP | 2004319628 | 11/2004 |

(Continued)

OTHER PUBLICATIONS

Park, "New Cooling Strategies for Greater Data Center Energy Efficiency", Facebook, Nov. 4, 2010, 4 pages.

(Continued)

*Primary Examiner* — Anthony Haughton
*Assistant Examiner* — Yahya Ahmad
(74) *Attorney, Agent, or Firm* — The Marbury Law Group, PLLC (57) ABSTRACT

Embodiments that allow for the air cooling of disk drives associated with liquid cooled nodes are disclosed. A node for performing computing operations includes a frame, a power supply coupled to the |frame|$_{[CB1]}$, and one or more liquid coolant-submersible motherboard assemblies. The one or more motherboard assemblies are configured to operate when submersed in a liquid coolant. The motherboard assemblies are mounted on the frame with one or more spaces between. The spaces form one or more channels between the motherboard assemblies. The frame includes an opening on at least one end of the one or more channels.

24 Claims, 9 Drawing Sheets

(52) U.S. Cl.
CPC ..... *H05K 7/20718* (2013.01); *H05K 7/20781* (2013.01); *H05K 7/20836* (2013.01)

(58) Field of Classification Search
USPC ...... 361/679.46–679.54, 688–723; 165/80.4, 165/80.5, 104.19–104.25, 301
See application file for complete search history.

(56) References Cited

U.S. PATENT DOCUMENTS

| | | | |
|---|---|---|---|
| 4,245,668 A | 1/1981 | Lindstrom | |
| 4,302,793 A | 11/1981 | Rohner | |
| 4,399,501 A | 8/1983 | Masselin | |
| 4,590,538 A | 5/1986 | Cray, Jr. | |
| 4,834,257 A | 5/1989 | Book et al. | |
| 5,260,850 A | 11/1993 | Sherwood et al. | |
| 5,297,621 A | 3/1994 | Taraci et al. | |
| 5,329,418 A | 7/1994 | Tanabe | |
| 5,414,591 A * | 5/1995 | Kimura | G06F 1/20 361/679.33 |
| 5,574,627 A | 11/1996 | Porter | |
| 5,851,143 A * | 12/1998 | Hamid | F24F 11/053 312/223.6 |
| 6,019,167 A | 2/2000 | Bishop et al. | |
| 6,374,627 B1 | 4/2002 | Schumacher et al. | |
| 6,600,656 B1 | 7/2003 | Mori et al. | |
| 6,621,707 B2 | 9/2003 | Ishimine et al. | |
| 6,909,606 B2 | 6/2005 | Barsun et al. | |
| 7,086,247 B2 | 8/2006 | Campbell et al. | |
| 7,184,269 B2 | 2/2007 | Campbell et al. | |
| 7,210,304 B2 | 5/2007 | Nagashima et al. | |
| 7,278,273 B1 | 10/2007 | Whitted et al. | |
| 7,307,841 B2 | 12/2007 | Berlin et al. | |
| 7,318,322 B2 | 1/2008 | Ota et al. | |
| 7,403,392 B2 | 7/2008 | Attlesey et al. | |
| 7,413,394 B2 | 8/2008 | Risser | |
| 7,609,518 B2 | 10/2009 | Hopton et al. | |
| 7,686,175 B2 | 3/2010 | Waisanen | |
| 7,724,517 B2 | 5/2010 | Attlesey et al. | |
| 7,757,506 B2 | 7/2010 | Ellsworth, Jr. et al. | |
| 7,843,298 B2 | 11/2010 | Hosokawa et al. | |
| 7,905,106 B2 | 3/2011 | Attlesey | |
| 7,911,782 B2 | 3/2011 | Attlesey et al. | |
| 7,911,793 B2 | 3/2011 | Attlesey | |
| 7,934,386 B2 | 5/2011 | Rummel et al. | |
| 7,971,632 B2 | 7/2011 | Eriksen | |
| 8,009,419 B2 | 8/2011 | Attlesey et al. | |
| 8,310,829 B2 | 11/2012 | Monk et al. | |
| 8,817,465 B2 | 8/2014 | Campbell et al. | |
| 9,049,800 B2 | 6/2015 | Shelnutt et al. | |
| 2002/0151799 A1 | 10/2002 | Pantages et al. | |
| 2002/0185262 A1 | 12/2002 | Baer | |
| 2003/0053293 A1 | 3/2003 | Beitelmal et al. | |
| 2003/0127240 A1 | 7/2003 | Beckbissinger et al. | |
| 2004/0008490 A1 | 1/2004 | Cheon | |
| 2004/0050491 A1 | 3/2004 | Miya et al. | |
| 2004/0223300 A1 | 11/2004 | Fink et al. | |
| 2004/0246683 A1 | 12/2004 | Honsberg-Riedl et al. | |
| 2005/0024826 A1 | 2/2005 | Bash et al. | |
| 2005/0052847 A1 | 3/2005 | Hamman | |
| 2005/0083657 A1 | 4/2005 | Hamman | |
| 2005/0111184 A1 | 5/2005 | Cliff et al. | |
| 2005/0114876 A1 | 5/2005 | Atarashi et al. | |
| 2005/0152112 A1* | 7/2005 | Holmes | G06F 1/20 361/695 |
| 2005/0259402 A1 | 11/2005 | Yasui et al. | |
| 2006/0026610 A1 | 2/2006 | Sasao et al. | |
| 2006/0064709 A1 | 3/2006 | Throckmorton et al. | |
| 2006/0123436 A1 | 6/2006 | Tanaka et al. | |
| 2006/0135042 A1 | 6/2006 | Frost et al. | |
| 2006/0250755 A1 | 11/2006 | Tilton et al. | |
| 2006/0274501 A1 | 12/2006 | Miller | |
| 2007/0006599 A1 | 1/2007 | Kawamura et al. | |
| 2007/0025081 A1 | 2/2007 | Berlin et al. | |
| 2007/0034360 A1 | 2/2007 | Hall | |
| 2007/0199340 A1 | 8/2007 | Knight et al. | |
| 2007/0213000 A1 | 9/2007 | Day | |
| 2007/0227710 A1 | 10/2007 | Belady et al. | |
| 2007/0267741 A1* | 11/2007 | Attlesey | G06F 1/20 257/714 |
| 2008/0002364 A1* | 1/2008 | Campbell | H05K 7/2079 361/699 |
| 2008/0017355 A1 | 1/2008 | Attlesey et al. | |
| 2008/0026509 A1 | 1/2008 | Campbell et al. | |
| 2008/0030945 A1 | 2/2008 | Mojaver et al. | |
| 2008/0055845 A1 | 3/2008 | Murakami et al. | |
| 2008/0158818 A1 | 7/2008 | Clidaras et al. | |
| 2008/0174954 A1 | 7/2008 | VanGilder et al. | |
| 2008/0180908 A1 | 7/2008 | Wexler | |
| 2008/0196868 A1 | 8/2008 | Attlesey et al. | |
| 2008/0196870 A1 | 8/2008 | Attlesey et al. | |
| 2008/0209931 A1 | 9/2008 | Stevens | |
| 2008/0273306 A1 | 11/2008 | Campbell et al. | |
| 2009/0168345 A1 | 7/2009 | Martini | |
| 2009/0229194 A1 | 9/2009 | Armillas | |
| 2009/0251860 A1 | 10/2009 | Belady et al. | |
| 2009/0260777 A1 | 10/2009 | Attlesey | |
| 2009/0262455 A1 | 10/2009 | Merrow | |
| 2010/0027212 A1 | 2/2010 | Daunert Armillas | |
| 2010/0061057 A1 | 3/2010 | Dersch et al. | |
| 2010/0103618 A1* | 4/2010 | Campbell | H05K 7/20772 361/699 |
| 2010/0165565 A1 | 7/2010 | Hellriegal et al. | |
| 2010/0226094 A1 | 9/2010 | Attlesey et al. | |
| 2010/0246118 A1 | 9/2010 | Attlesey | |
| 2010/0263885 A1 | 10/2010 | Tuma | |
| 2010/0275441 A1 | 11/2010 | Rasmussen et al. | |
| 2010/0290190 A1 | 11/2010 | Chester et al. | |
| 2010/0302678 A1 | 12/2010 | Merrow | |
| 2011/0075353 A1 | 3/2011 | Attlesey et al. | |
| 2011/0132579 A1* | 6/2011 | Best | H05K 7/20763 165/104.31 |
| 2011/0134604 A1* | 6/2011 | Attlesey | G06F 1/20 361/679.47 |
| 2011/0240281 A1 | 10/2011 | Avery | |
| 2011/0267775 A1 | 11/2011 | VanDerVeen et al. | |
| 2012/0026691 A1 | 2/2012 | Campbell et al. | |
| 2012/0035773 A1 | 2/2012 | Stabinski et al. | |
| 2012/0123595 A1 | 5/2012 | Bower, III et al. | |
| 2012/0155027 A1 | 6/2012 | Broome et al. | |
| 2012/0236487 A1 | 9/2012 | Wallace et al. | |
| 2012/0300391 A1 | 11/2012 | Keisling et al. | |
| 2013/0025888 A1 | 1/2013 | Eckholm et al. | |
| 2013/0032217 A1 | 2/2013 | Pesek et al. | |
| 2013/0105139 A1 | 5/2013 | Campbell et al. | |
| 2013/0146273 A1* | 6/2013 | Chester | H05K 7/20772 165/287 |
| 2014/0085817 A1 | 3/2014 | Campbell et al. | |
| 2014/0085821 A1 | 3/2014 | Regimbal et al. | |
| 2014/0109610 A1 | 4/2014 | Wulf et al. | |
| 2014/0211412 A1 | 7/2014 | Best | |
| 2014/0216686 A1 | 8/2014 | Shelnutt et al. | |
| 2014/0218858 A1* | 8/2014 | Shelnutt | G06F 1/206 361/679.31 |
| 2014/0301037 A1* | 10/2014 | Best | H05K 7/20781 361/679.53 |
| 2014/0307384 A1 | 10/2014 | Best | |
| 2014/0362527 A1 | 12/2014 | Best | |

FOREIGN PATENT DOCUMENTS

| | | |
|---|---|---|
| JP | 2004363308 | 12/2004 |
| WO | 2007023130 A2 | 3/2007 |
| WO | 2007098078 A2 | 8/2007 |
| WO | 2008027931 A2 | 3/2008 |
| WO | 2008089322 A2 | 7/2008 |
| WO | 2010019517 A1 | 2/2010 |

(56) References Cited

FOREIGN PATENT DOCUMENTS

| WO | 2013022805 A1 | 2/2013 | |
|---|---|---|---|
| WO | WO 2013022805 A1 * | 2/2013 | ......... H05K 7/20772 |

OTHER PUBLICATIONS

Hernandez, "Will IT Managers Warm to Liquid-Cooled Servers?", Dec. 8, 2009, 3 pages.
Non-Final Office Action in U.S. Appl. No. 14/667,091, mailed May 22, 2015, 30 pages.
Substantive Examination Adverse Report, Malaysian Application No. PI2011000494, mailed May 15, 2015, 3 pages.
Australian Government IP Australia, Patent Examination Report No. I for Application No. 2009282170, Nov. 15, 2013, 4 pages, Australia.
Patent Examination Report No. 2 from Australian Application No. 2009282170, issued Jun. 18, 2014, pp. 1-4.
U.S. International Searching Authority, International Search Report & Written Opinion for PCT/US2012/049668, Oct. 19, 2012, Alexandria, VA, US.
Office Action from Chinese Application No. 200980131707.3, issued Dec. 31, 2014, English and Chinese versions, pp. 1-10.
Office Action from Chinese Application No. 200980131707.3, issued Apr. 3, 2014, English translation, pp. 1-4.
The State Intellectual Property Office of the People's Republic of China, Notice on the First Office Action for Application No. 200980131707.3, Dec. 20, 2012, China.
The State Intellectual Property Office of the People's Republic of China, Notice on the second Office Action for Application No. 200980131707.3, Jul. 31, 2013, China.
Office Action from Chinese Application No. 200980131707.3, issued Apr. 18, 2014, English and Chinese versions, pp. 1-7.
Office Action from Chinese Application No. 200980131707.3, issued Jul. 31, 2013, English translation, pp. 1-8.
U.S. Appl. No. 14/338,035, filed Jul. 22, 2014, Christiaan Scott Best, 60 pages.
U.S. Appl. No. 14/338,013, filed Jul. 22, 2014, Christiaan Scott Best, 60 pages.
U.S. Appl. No. 14/338,020, filed Jul. 22, 2014, Christiaan Scott Best, 60 pages.
U.S. Appl. No. 14/338,026, filed Jul. 22, 2014, Christiaan Scott Best, 60 pages.
U.S. Appl. No. 14/667,091, filed Mar. 24,2015, Christiaan Scott Best, 65 pages.
U.S. International Searching Authority, International Search Report and Written Opinion for PCT/US2009/053305, Oct. 14, 2009, Alexandria, VA, US, 2 pages.
Final Office Action, U.S. Appl. No. 13/057,881, 30 pages, mailed Jun. 16, 2015.
Office Action from U.S. Appl. No. 13/057,881, issued Mar. 3, 2015, 20 pages.
Office Action from U.S. Appl. No. 13/057,881, issued Jan. 9, 2015, 3 pages.
Final Office Action from U.S. Appl. No. 13/057,881, issued Nov. 3, 2014, 23 pages.
Applicant-Initialed Interview Summary from U.S. Appl. No. 13/057,881, issued Oct. 9, 2014, 3 pages.
Applicant-Initialed Interview Summary from U.S. Appl. No. 13/057,881, issued Jul. 1, 2014, 3 pages.
Office Action from U.S. Appl. No. 13/057,881, issued Apr. 11, 2014, 16 pages.
Applicant-Initialed Interview Summary from U.S. Appl. No. 13/057,881, issued Feb. 25, 2014, 4 pages.
Final Office Action from U.S. Appl. No. 13/057,881, issued Nov. 22, 2013, 13 pages.
Office Action from U.S. Appl. No. 13/057,881, issued Jun. 4, 2013, 9 pages.
U.S. Appl. No. 13/057,881, filed Feb. 7, 2011, Christiaan Scott Best, 72 pages.
Supplemental Search Report, European Application No. 12821634.8, mailed Jul. 15, 2015, 6 pages.
Intellectual Property Office of Singapore, Written Opinion and Search Report for Application No. 201100595-6, Apr. 16, 2012, 20 pages, Singapore.
International Search Report & Written Opinion, Application No. PCT/US15/30618, mailed Aug. 5, 2015, 12 pages.
International Search Report & Written Opinion, Application No. PCT/US14/33081, mailed Aug. 27, 2014, 9 pages.
International Search Report & Written Opinion, Application No. PCT/US14/33834, mailed Sep. 15, 2014, 16 pages.
International Search Report & Written Opinion, Application No. PCT/US2014/037005, mailed Sep. 24, 2014, 18 pages.
International Search Report & Written Opinion, Application No. PCT/US14/17835, mailed Jun. 13, 2014, 9 pages.
Notice of Acceptance, Australian Application No. 2009282170, mailed Nov. 14, 2014, 2 pages.
International Search Report & Written Opinion, Application No. PCT/US15/43468, mailed Oct. 30, 2015, 11 pages.
Office Action, Canadian Application No. 2,731,994, mailed Dec. 3, 2015, 6 pages.
International Preliminary Report on Patentability, Application No. PCT/US2014/033081, mailed Aug. 27, 2014, 9 pages.
International Preliminary Report on Patentability, Application No. PCT/US2014/037005, mailed Sep. 24, 2014, 18 pages.
Office Action, Chinese Application No. 201280049039.1, mailed Oct. 27, 2015, 33 pages.
Non-final Office Action, U.S. Appl. No. 14/245,978, mailed Jan. 13, 2016, 11 pages.
Non-final Office Action, U.S. Appl. No. 14/251,014, mailed Dec. 4, 2015, 13 pages.
Non-final Office Action, U.S. Appl. No. 14/271,386, mailed Dec. 17, 2015, 17 pages.
Non-final Office Action, U.S. Appl. No. 14/237,100, mailed Sep. 30, 2015, 30 pages.
Markoff, "Data Centers' Power Use Less Than Was Expected", The New York Times, Jul. 31, 2011, 3 pages.
"The Green500 List—Nov. 2013", The Green 500, Nov. 20, 2013, 3 pages. [http://www.green500.org].
Hernandez, "Are Liquid-Cooled Servers Coming to a Data Center Near You?", CleanTech, Dec. 4, 2009, 2 pages.
"Green Revolution Cooling Named a Disruptive Technology of the Year at SC'10", Press Release, Nov. 1, 2010, New Orleans, LA, 1 page.
"Green Revolution Cooling Named Disruptive at SC'09", Press Release, Aug. 3, 2009, Austin, TX, 1 page.
"Disruptive Technologies", SC|09 Disruptive Technologies Presentations, Nov. 14-20, 2009, Portland, Oregon, http://sc09.supercomputing.org/index-pg=disrupttech.html, (2 pages).
"Disruptive Technologies", SC10 Disruptive Technologies, Nov. 13-19, 2010, New Orleans, Louisiana, http://sc10.supercomputing.org/index-pg=disrupttech.html, (8 pages).

* cited by examiner

SYSTEM AND METHOD FOR AIR-COOLING HARD DRIVES IN LIQUID-COOLED SERVER RACK

PRIORITY CLAIM

This application claims the benefit of U.S. Provisional Application Ser. No. 61/996,608 entitled "Method for integrating air cooler hard drives with the carnotjet system" filed May 13, 2014, which is incorporated herein by reference in its entirety.

BACKGROUND

Field

The present invention relates generally to providing resources for computing. More particularly, the present disclosure relates to systems and methods for packaging computing and associated components for space efficiency and cooling while retaining compatibility with hard drives that cannot operate when submersed in a liquid.

Description of the Related Art

A data center typically includes a group of computing devices at a common physical location. Data centers are often housed in conventional building structures and use air conditioning systems to remove heat generated by electronic components (chips, hard drives, cards, etc.).

Many commercially-available servers used in data centers are designed for air cooling. Such servers usually comprise one or more printed circuit boards having a plurality of electrically coupled devices mounted thereto. These printed circuit boards are commonly housed in an enclosure having vents that allow external air to flow into the enclosure, as well as out of the enclosure after being routed through the enclosure for cooling purposes. In many instances, one or more fans are located within the enclosure to facilitate this airflow.

Data centers housing such servers and racks of servers typically distribute air among the servers using a centralized fan (or blower). As more fully described below, air within the data center usually passes through a heat exchanger for cooling the air (e.g., an evaporator of a vapor-compression cycle refrigeration cooling system (or "vapor-cycle" refrigeration), or a chilled water coil) before entering a server. In some data centers, the heat exchanger has been mounted to the rack to provide "rack-level" cooling of air before the air enters a server. In other data centers, the air is cooled before entering the data center.

In general, electronic components of higher performing servers dissipate correspondingly more power. However, power dissipation for each of the various hardware components (e.g., chips, hard drives, cards) within a server can be constrained by the power being dissipated by adjacent heating generating components, the airflow speed and airflow path through the server, and the packaging of each respective component, as well as a maximum allowable operating temperature of a respective component and a temperature of the cooling air entering the server as from a data center housing the server. The temperature of an air stream entering the server from the data center, in turn, can be influenced by the power dissipation and proximity of adjacent servers, the airflow speed and the airflow path through a region surrounding the server, as well as the temperature of the air entering the data center (or, conversely, the rate at which heat is being extracted from the air within the data center).

It requires a substantial amount of space to house data centers in conventional buildings. In addition, servers deployed in buildings may not portable and may be expensive, as energy costs and power dissipation continue to increase. Air cooling of a data center is also space intensive, because the efficiency of cooling is affected by the proximity of electronic components.

In some data centers, servers are operated in a bath or stream of liquid coolant. The liquid coolant may effectively remove heat from heat-producing components on the servers. Nevertheless, in many rack-based systems, one server cannot be removed or serviced without disrupting operation of other servers in the rack. In addition, some components used in conventional servers are not suited for sustained exposure to liquid coolants. For example, some polymer components, such as polyvinyl chloride connector components, degrade when immersed in some coolant oils.

SUMMARY

Embodiments of systems and methods of packaging and operating computing resources are described herein. In an embodiment, the motherboard and various computing components are submerged in a cooling liquid while the disk drive is held in a hard drive mount above the liquid. The hard drive mount is thermally connected to a heat exchanger that transfers heat to the cooling liquid, thereby efficiently cooling the disk drive while keeping it out of the cooling liquid.

In some embodiment the hard drive is cooled by air surrounding the hard drive. In one embodiment the air is moved by a convective current (e.g., natural convection, or a combination of natural and forced convection). In another embodiment the air is moved by a fan. In certain embodiments, a heat exchanger is associated with the fan, which facilitates the removal of heat from the air that is moved by the fan over the disk drive. In certain embodiments the heat exchanger is thermally coupled to the same cooling liquid that the motherboard and various computing components are submerged in. In another embodiment the heat exchanger is connected to a fluid flow circuit that draws heat away from the heat exchanger.

The hard drives may be mounted to a variety of structures, including standard server chasses, drive caddies, as well as customized sheets of material.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

In various embodiments, a plurality of servers is mounted vertically in a rack. The servers may be vertically removed and replaced from a rack with an open top. The servers may be mounted in an array, arranged horizontally. Each server may be removed without affecting the functionality of other servers in the rack or in the data center. Each server may operate independently of each of the servers.

In some embodiments, spacing and structure allow for accommodation of many different form factors, including but not limited to conventional rack mount servers normally used for air cooling. Servers may be mounted adjacently to each other to minimize upward flow around the servers or motherboards.

In some embodiments, dielectric fluid is pumped out of a rack, cooled by flowing through a heat exchanger, and pumped back into the rack. In other embodiments, the heat exchanger is located inside the rack. A secondary liquid circuit flows into the rack with dielectric fluid, and through a heat exchanger, cooling the dielectric fluid.

In one embodiment, a dielectric coolant flows out of a rack at an elevated temperature. A circuit may include a pump, heat exchanger, and measurement devices. A secondary circuit flows through the above heat exchanger, cooling the dielectric fluid, then flows outside and dissipates heat external to the room housing the dielectric-filled rack.

In some embodiments, a second heat exchanger is mounted to a rack. The second heat exchanger cools air that is circulated over the disk drives. In some embodiments the second heat exchanger is cooled by the same dielectric fluid cooled by the first heat exchanger. In other embodiments it is cooled by the same secondary circuit that cools the first heat exchanger. In other embodiments it has its own tertiary circuit for cooling.

Systems and methods of cooling and operating electronic devices using liquid coolant-filled racks may be as described in US Patent Publication No. 2011/0132579 (the "'579 Publication"), by Best et al., published Jun. 9, 2011, which is incorporated by reference in its entirety as if fully set forth herein.

Figure 1A:
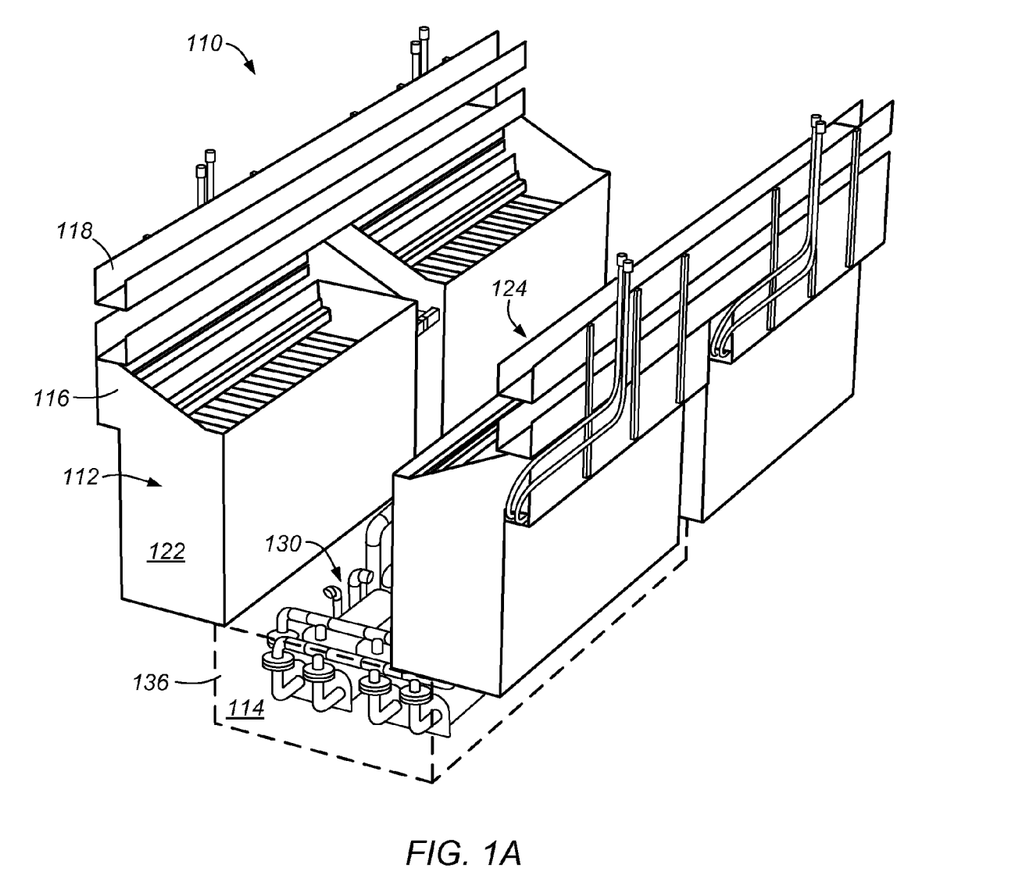
FIG. 1A illustrates an embodiment of computing system including enclosed cooling module for maintaining racks under the floor of an aisle between the racks.

FIG. 1A illustrates one embodiment of a computing system with an under-floor cooling module between two rows of racks. Computing system 110 includes racks 112. A cooling system 114 is provided for each rack. Each of racks 112 is supplied power through a power distribution unit 116. Cable trays 118 hold cables that supply power or enable exchange of data between servers in racks 112 and external systems.

Each of racks 112 includes tank 122. In the embodiment shown in FIG. 1A, a plurality of tanks 122 are provided, each tank 122 containing vertically mounted, independently removable and replaceable data processing modules. As shown in FIG. 1A, in this embodiment, tanks 122 are arranged in two banks adjacent an aisle 124. The tanks may be arranged in other configurations, however. For example, a single bank of tanks 122 may be installed in the center of the unit with aisles on either side of tanks 122. Or a single bank of tanks 122 may be installed against a wall of an enclosure (e.g., a shipping container housing racks and the cooling module.)

Cooling system 114 includes pumps 130, one or more heat exchangers, and associated pipes and control systems. Pumps 130 and the heat exchanger(s) are included in the form of pump module 135. Pump module 135 includes enclosure 136. Enclosure 136 houses the pumps and other components of pump module 135.

The pipes in between the rack and the pump module may be made of steel or another temperature resistance material such that if a fire breaks out, the oil carrying pipes will not melt and will contain the fluid. In addition, the enclosure for the pump module and the rack housing may be made of a fire-retardant material, such as steel.

In some embodiments, the floor of aisle 124 (which, in the embodiment shown in FIG. 1, is the top of the enclosure for the cooling module) is permeable such that coolant (for example, oil) can drip through the floor into the cooling module. Allowing coolant on the floor to seep into a porous material may extinguish or suppress fire (for example, by isolating the oil in the pores of the material from air).

The top of a pump module and any removable service panels for a pump module may be made of flame resistant material. The top of the pump module may have a permeable surface such that any coolant (for example, oil) that has spilled into the aisle drains drips through the top and passes into pump module. In certain embodiments, the system includes one or more trays or pans that collect spilled fluid around the rack or pump module and drain it into the pump module.

Figure 1B:
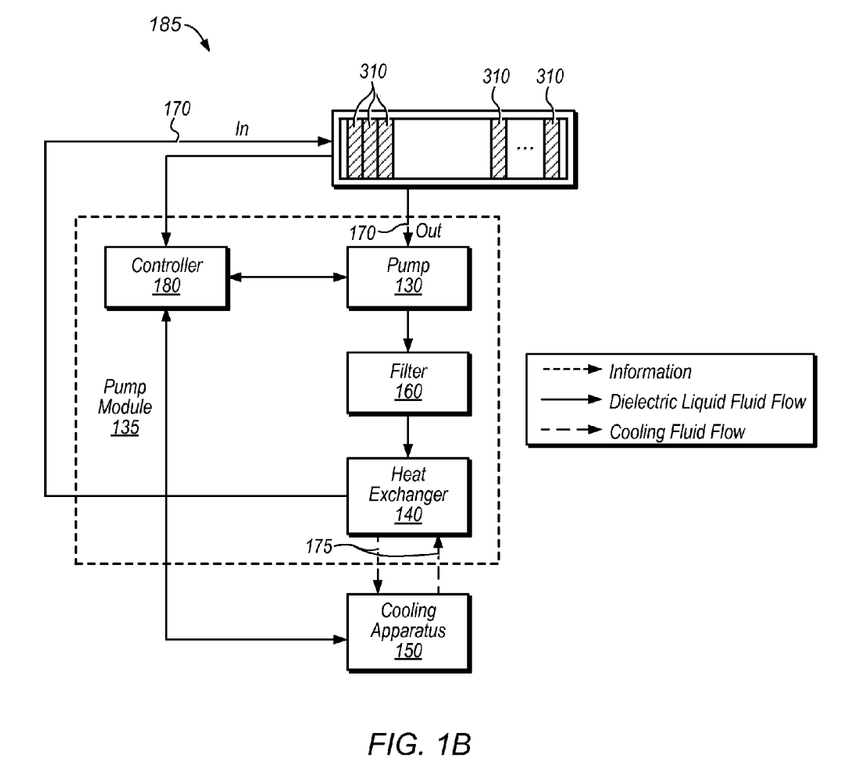
FIG. 1B illustrates one embodiment of an exemplary system for efficiently cooling a plurality of independently operable data processing modules.

As shown in FIGS. 1A and 1B, module 135, which may include at least elements as shown in FIG. 1B, for example, provided cooling for tanks 122, according to one or more embodiments. That is, according to one or more embodiments, each pump module 135 may include primary and secondary pumps 130 (and associated pump motors) connected to filter 160 and liquid coolant heat exchanger 140 of at least one bank of tanks 122 via fluid circuit 170 such that primary and secondary pumps 130 may function independently of one another for backup purposes, with electrically isolated pump 130 motors. According to one or more embodiments, primary pump 130 motor is controlled by variable speed controller 180 for regulating temperature of coolant loop 170 by varying liquid coolant flow, whereas secondary pump motors may be fixed-speed and controlled by on-off control.

Module 135 for cooling apparatus 150, according to one or more embodiments, includes a controller for controlling a pump motor in loop 175, which may be on-off control or variable speed control, according to one or more embodiments, and includes a controller for one or more fan motors, which may be like controller 180 of FIG. 1B, for example, but for regulating fans speed of cooling apparatus 150 in order to control temperature of cooling loop 175 by varying air flow over final heat exchanger 152. A pump, motor controller, and cooling water loop may also be provided to run water over the exterior of a heat exchanger external to module 135 for additional cooling. In one or more embodiments the cooling apparatus is an evaporative cooling apparatus and the final heat exchanger is an evaporative final heat exchanger.

Controllers 180 may be interfaced via a network with a master controller for which a single dashboard is provided, according to one or more embodiments, which is for displaying and controlling water flow in one or more loops through one or more cooling towers, fan power for air flow across the one or more heat exchangers, one or more cooling towers, and liquid coolant flow in one or more loops for tanks 122. Preferably, a master controller optimizes all elements for minimum power consumption of the system while maintaining sufficient cooling. The network controller performs diagnostic testing of each element separately for functionality and reports the functionality back to a single user. This single management point makes the system more reliable and more efficient, since the master controller can obtain maximum efficiency for all components. In some embodiments, control is carried out as described in the '579 Publication.

A control module may connect into a larger monitoring system, such as a building management system, data center management system, stand alone or other manner of operations. In some embodiments, the control module controls and monitors external components, such as building water pumps, cooling towers, remote battery backup components, other modules, remote power generators, security, room power distribution units, rack power distribution units, and other systems.

Power distribution units 116 mount near the back of the racks 112, under the lid area. In this embodiment, the only in/out cable in the rack may be the main power feed(s) for the power distribution unit. This arrangement may minimize the amount of space necessary for users to service the back of the rack.

A single or multiple power feed(s) may feed electronic systems in the module. The power feed may be at voltages such as 208, 240, 277, 480 VAC, or DC voltages in the case of systems using DC battery backup or distribution system. A single feed may go into a power distribution center, or multiple power distribution centers or subpanels, to connect all required loads and/or if redundancy is required.

The power distribution system may include a transformer that adjusts (and, if required, isolates) the input AC voltage to the required load voltages. The power may be distributed into multiple ports. Each or a group may include a breaker. Each port may connect, for example, to a rack-level power rack distribution device (e.g., outlet strip) attached to the racks and/or the liquid-filled rack system. Alternatively, loads may be wired into the distribution system directly or other manner of connection. In some embodiments, power distribution components may adjust DC power from a distribution voltage to a load voltage.

Referring now specifically to FIG. 1B, computing system 110 may include a cooling system 185 for transferring heat from data processing modules 310. The liquid coolant heated by data processing modules 310 is fluidly coupled through suitable piping or lines to a pump 130, which pumps the heated liquid coolant through suitable piping or lines to a heat exchanger 140 associated with a heat-rejection or cooling apparatus 150. In some embodiments, heat exchanger 140 is remotely or distally located from tank 122 and/or computing system 110. Heat exchanger 140 rejects the heat from the incoming heated liquid coolant and fluidly couples the cooled liquid coolant through a return fluid line or piping 170 back into the tank 122. Thus, at least a portion of the liquid coolant completes a fluid circuit through the data processing modules 310 in tank 122, pump 130, heat exchanger 140, and back into tank 122. The heat rejected from the heated liquid coolant through the heat exchanger 140 may then be selectively used by alternative heat rejection or cooling apparatus 150 to dissipate, recover, or beneficially use the rejected heat depending on the different environmental conditions or data processing modules 310 operating conditions to which the system is subject.

Figure 1C:
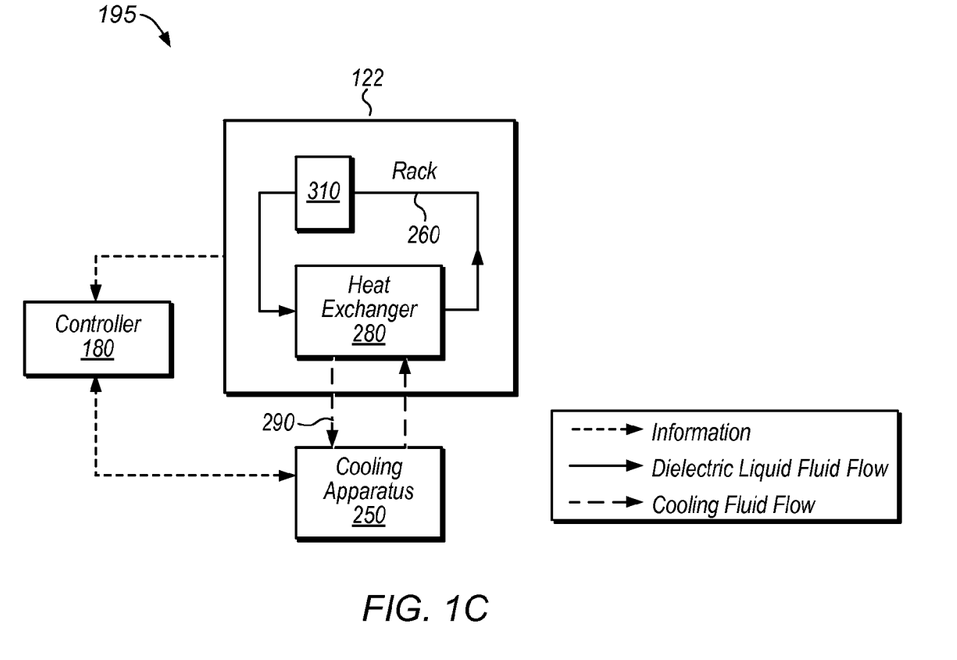
FIG. 1C illustrates an alternative embodiment of an exemplary system for efficiently cooling a plurality of independently operable data processing modules.

Referring now to FIG. 1C, an embodiment of an alternative cooling system 195 is illustrated for cooling data processing modules 310. Unlike the cooling system 185, heated liquid coolant does not flow outside the tank 122. Instead, one fluid circuit 260 of the flowing liquid coolant is completely internal to the tank 122. A thermal coupling device 280, such as a heat exchanger, is mounted within the tank 122 within the fluid circuit through the data processing modules 310, so that at least a portion of the heated liquid coolant flow exiting the data processing modules flows through the thermal coupling device 280. Cooled liquid coolant exits the coupling device 280 and at least a portion of the cooled dielectric coolant circulates in the internal fluid circuit 260 back through the data processing modules 310.

Cooling systems 185 (FIG. 1B) and 195 (FIG. 1C) include a computer controller 180 with suitable applications software for implementing various embodiments. A detailed description of controller 180 is included in international published patent application WO 2010019517 which is incorporated by reference as if fully set forth herein. In some embodiments, temperatures of operation may be established and maintained as set forth in the WO 2010019517 application.

Referring now to FIG. 1B, cooling apparatus 150, which may provide an evaporative final heat exchanger and a motor driven fan for forcing air flow through the final heat exchanger, is located sufficiently far away from tanks 122 to enable adequate heat dissipation at the heat exchanger to cool the heated liquid in loop 175. The resulting heat may be vented to the ambient outside environment. Alternately, the resulting heat may be beneficially used, as described in PCT patent application WO 2013022805. The cooled liquid is then recirculated through the return pipe in loop 175 to cool the liquid coolant in loop 170 which, in turn, cools the data processing modules 310 in tanks 122. In some embodiments, cooling apparatus 150 is mounted on the exterior top of a container for the computing system.

Although one cooling apparatus 150 is shown, more than one may be provided in various embodiments. For example, one cooling apparatus 150 may be provided for each bank of tanks 122. Further, cooling loops (for example, cooling loop 175) may be arranged, and each cooling apparatus 150 may be sized, so that a plurality of cooling apparatus 150 may provide backup cooling for one other. Cooling apparatus 150 need not be attached to the shipping container.

In some embodiments, two or more racks are mounted next to each other, and cable trays extend across two or more racks. The individual racks and cable tray may combine to form one rack. For example, as shown in FIG. 1A, cable tray 118 may extend across two of racks 112.

Figure 1D:
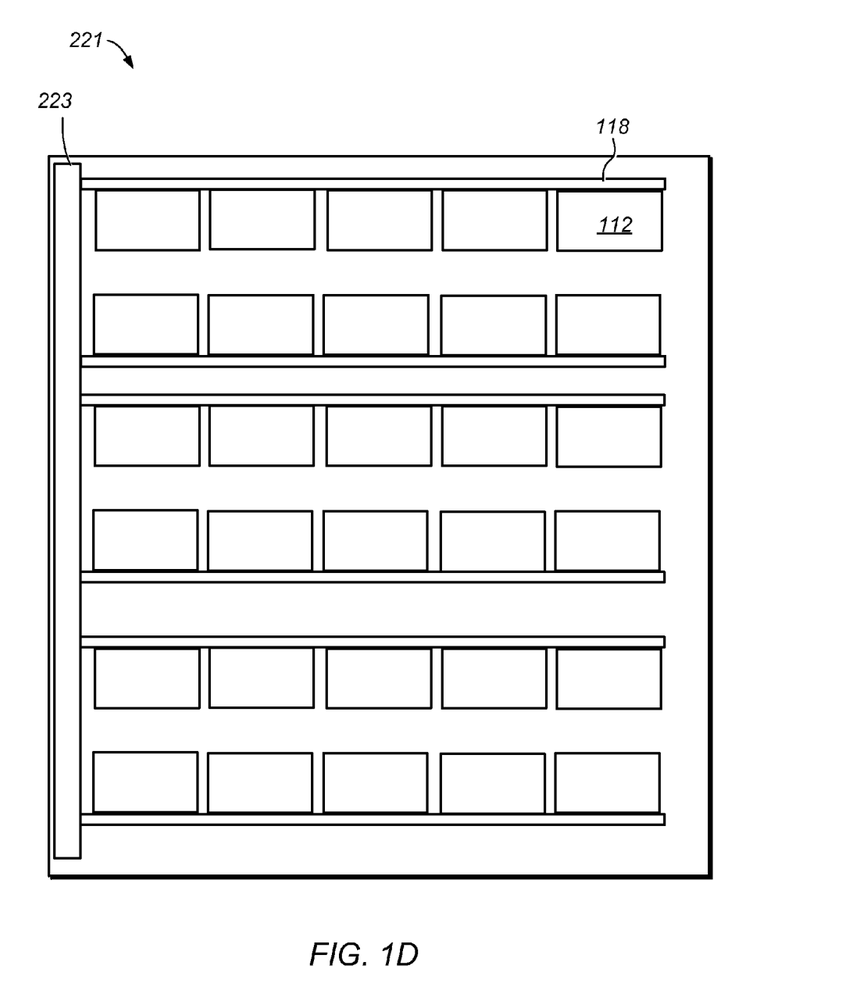
FIG. 1D illustrates a schematic plan view of one embodiment of a data center including cable trays extending across rows of racks.

In certain embodiments, cable trays hold cables that run from one end of the data center to the other (as opposed, for example, to the cable trays in the rack that hold cables that run between components in the rack (server to rack mount switch). FIG. 1D illustrates one embodiment of a data center with cable trays extending across a data center. Cable trays 118 in data center 221 span across racks 112 to a common wall including power distribution system 223, which provides power to each of the rows of racks via cables in cable trays 118.

Figure 2:
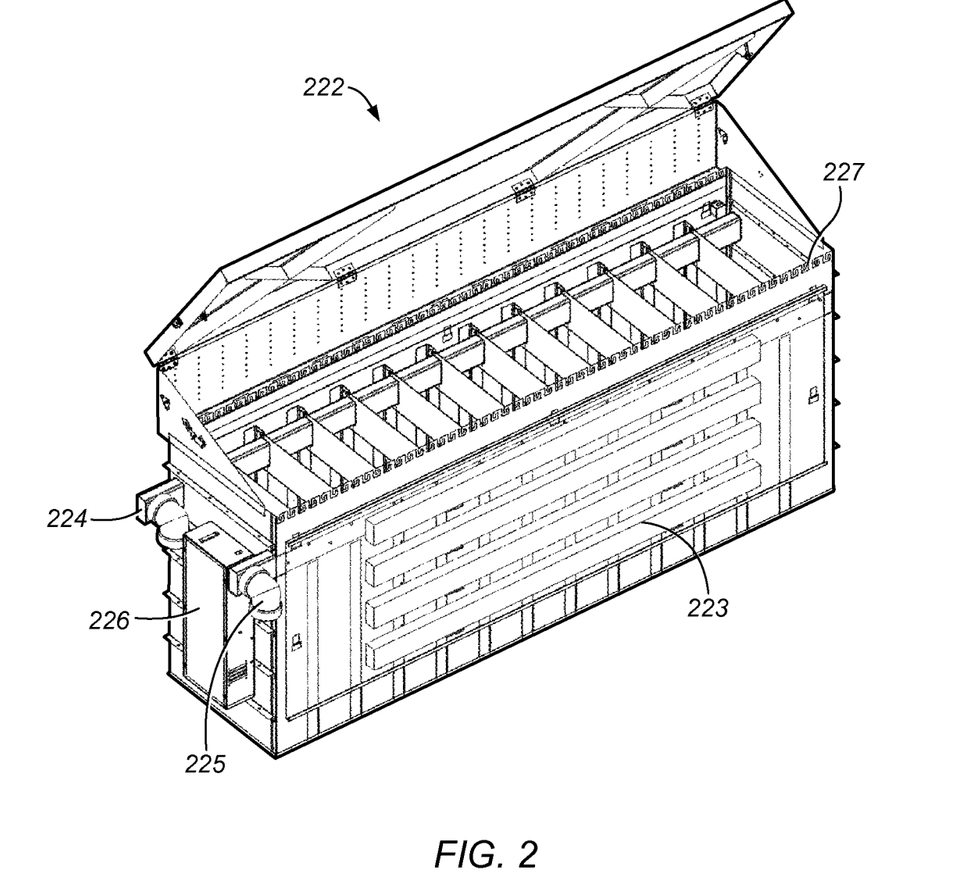
FIG. 2 illustrates a rack that can be used in a computing module in various embodiments.

FIG. 2 illustrates a rack that can be used in a computing module in various embodiments. Rack 222 includes power distribution units 223, liquid coolant inlet port 224, liquid coolant exit port 225, and rack control module 226.

Rack 222 includes a cable management system. Cable management system includes cable management rails 227. Each of cable management rails 227 includes a series of cable guides. The cable guides may be used to guide and support power cables or data cables for each of the servers in rack 232. In some embodiments, cables and cable connector receptacles remain above the surface level of the coolant in the rack.

Figure 3:
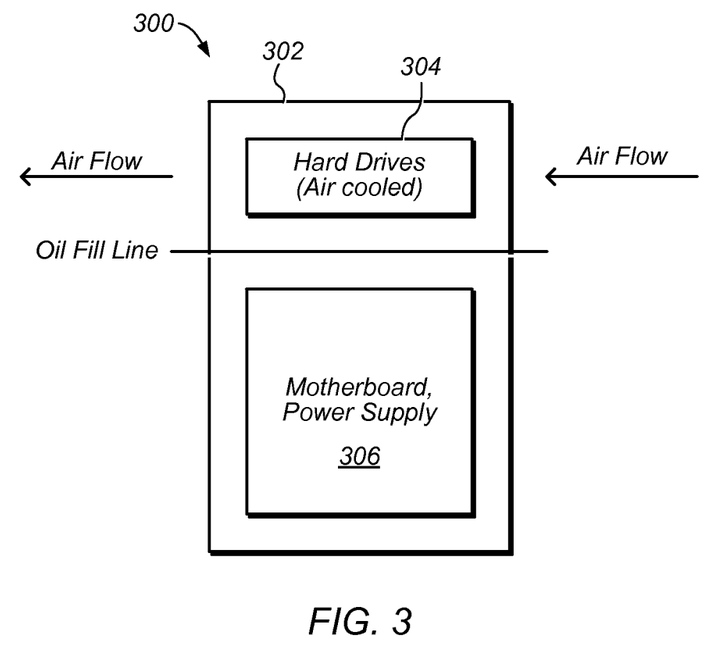
FIG. 3 illustrates a disk drive cooling scheme utilized in certain embodiments.

FIG. 3 illustrates one embodiment where, in cooling system 300, disk drives 304 are held above the liquid coolant contained in tank 122. The surface of the liquid coolant is demarcated by the "Oil Fill Line". Node 302 includes a motherboard and power supply 306 that are submerged in liquid coolant. While the motherboard and power 20 supply 306 are depicted as completely submerged in this illustration, in certain embodiments they are not completely submerged. The disk drives 304 are cooled by air circulated over their surfaces. Disk drives 304 may be a single disk drive or a plurality of disk drives, in certain embodiments the disk drives 304 are unsealed and cannot operate if submerged in the liquid coolant. In other embodiments at least one of the disk drives 304 is compatible with the liquid coolant and is submerged in the liquid coolant while the other disk drives 304 are not. In certain embodiments the disk drives 304 are mounted directly to the same structural element as the other components of node 302, while in certain other embodiments the drives are mounted to a separate removable caddy that is attached to the structural element. The caddy facilitates the swapping of disk drives and other activities that require that the drives be removed from the system without removal of the entire node associated with the caddy.

In certain embodiments the disk drives 304 are part of node 302 such that they are considered a single entity, e.g., they constitute a single server. In certain other embodiments the disk drives 304 are mounted separately from the rest of the node, e.g., an array of disk drives mounted on the back or front of the tank with cables to respective nodes that they connect to. Though physically separated, each set of disk drives and the node they connect to constitute a single entity, e.g., a single server.

Disk drives often contain internal components that cannot operate in a liquid environment. For example, mechanical disk drives contain spinning platters that would not be able to spin within their operating parameters is submerged in liquid. Accordingly, there are commercially available sealed drives that do not allow liquid into the drive and can operate while submerged. These sealed drives are may contain helium gas internally. However, there are many commercially available unsealed drives that cannot be submerged in liquid coolant, so it is desirable to modify the disclosed liquid cooling apparatus to keep the disk drives out of the liquid coolant, thereby enabling the use of disk drives that would otherwise be incompatible with the liquid coolant scheme. In certain embodiments a plurality of disk drives may be used, where some are operable if submerged in liquid and others are not. In such embodiments, drives that are operable if submerged in liquid may be submerged in liquid coolant while the drives that are not operable if submerged are held away from the liquid coolant. Furthermore, in a given rack some nodes may include submerged disk drives while others do not.

For ease of servicing it is preferable for the disk drives to be positioned above the surface of the cooling liquid. As disk drives generate a relatively small fraction of the heat generated by a computing system, they can often be air cooled by ambient air without substantially lowering the efficiency of the overall disclosed cooling apparatus.

Additionally, many commercially available disk drives can reliably operate at 50 degrees Celsius or higher, so they have relatively small cooling demands that can be met by air cooling. Furthermore, by placing the disk drives above the liquid, standard commercially available server chasses may be used, wherein the chassis is vertically oriented such that it that holds the disk drives above the liquid coolant while substantially submerging other heat producing components, such as processors and power supplies. Standard chasses may also be modified by elongating the chasses or enlarging a caddy that holds the disk drives so that the disk drives are above the liquid coolant. Further, an extension cable may be required to connect the disk drives to the connector, which is now further away. However, since many commercially available chasses are designed to be horizontally oriented, airflow around the disk drives may be suboptimal as air flow may be impeded by the surface of the liquid coolant. However, the use of such commercially available chasses may be desirable for other reasons, such as cost or familiarity with the components, and is claimed.

In certain embodiments the air flow may be created by a convection air current generated by the air in the vicinity of the disk drives being heated by said drives. The heated air then rises away from the disk drives, drawing in cooler air to the vicinity of the disk drives to replace the escaping heated air. In this way air flow is achieved without the need for forced induction, e.g., a fan. In certain embodiments various parameters may be tweaked to optimize convective air flow. For example, the spacing between disk drives or sets of disk drives may be optimized to facilitate the movement of air. Ducting might also be included to direct air flow. Furthermore, structural elements such as the rack holding various computing components may be shaped in a manner to direct air flow in a manner conducive to convective air flow. Thus, in some certain embodiments structural elements may also constitute ducting and the ducting may be considered integrated into the structural element. The positioning of the disk drives may be lowered so as to increase the distance between the drives and the heated air that has already moved away from the drives or otherwise increase the thermal gradient of traversed by the convective air flow.

In certain embodiments the air flow depicted in FIG. 3 is generated by a fan. In certain embodiments the air used to cool the disk drives is cooled by a heat exchanger as described below. A heat exchanger is useful in environments where the ambient temperature air is too high for the disk drives. The heat exchanger may be used with either a convective air flow, forced air flow generated by a fan, or both.

Figure 4:
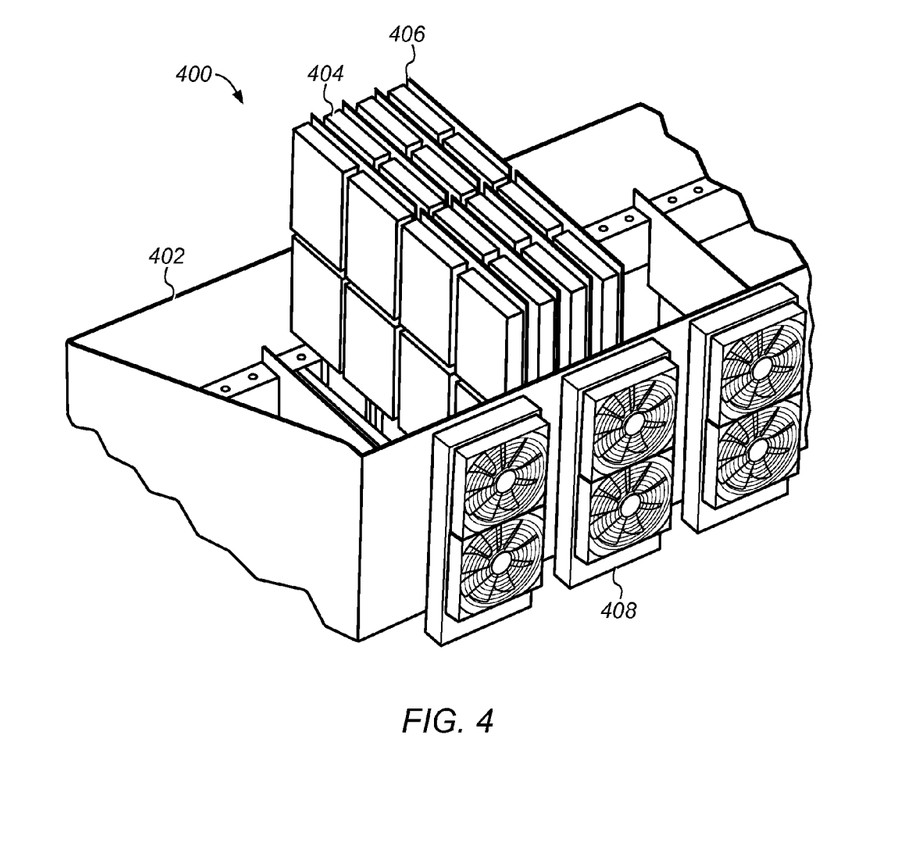
FIG. 4 illustrates an embodiment including multiple fans and disk drives.

FIG. 4 illustrates cooling apparatus 400 which, according to one or more embodiments, includes a controller for controlling fans 408, which may be on-off control or variable speed control. The controller which may be like controller 180 of FIG. 1B, for example, but for regulating fans speed of cooling apparatus 400 in order to control temperature of disk drives 404 by varying air flow over them. The controller may monitor a variety of variables related to the temperature of the overall system or the disk drives, including but not limited to temperature of the disk drives 404, temperature of the air entering the fan, temperature of the air after it passes over the disk drives 404, temperature of the liquid coolant, and temperature of another liquid used by a heat exchanger. The controller might also draw data from sensors on the disk drives 404, which may monitor such information as disk drive temperature, S.M.A.R.T. data, and other variables related to the health of the disk drives 404. The disk drives 404 are mounted to node plate 406, which, according to one or more embodiments, is part of the same plate that holds heat generating components of the node.

In certain embodiments disk drives 404 are mounted to a caddy which may be readily removed from the rest of the node. A caddy may include one or more disk drives and in some embodiments a plurality of disk drives may be stacked in multiple layers.

In certain embodiments fans 408 may also include one or more heat exchangers, substantially similar to heat exchanger 140 in FIG. 1B, to cool air blown by fans 408. The heat exchanger may further include a pump, motor controller, and cooling liquid loop. The heat exchanger may transfer heat to the cooling liquid in tank 402 or may transfer heat to another location sufficiently far away from tank 402 to enable adequate heat dissipation. The cooling liquid loop may use a separate liquid or may use the liquid coolant in the tank 402. In certain embodiments the heat exchanger may directly transfer heat to the cooling liquid without the use of a pump or cooling liquid loop.

Figure 5:
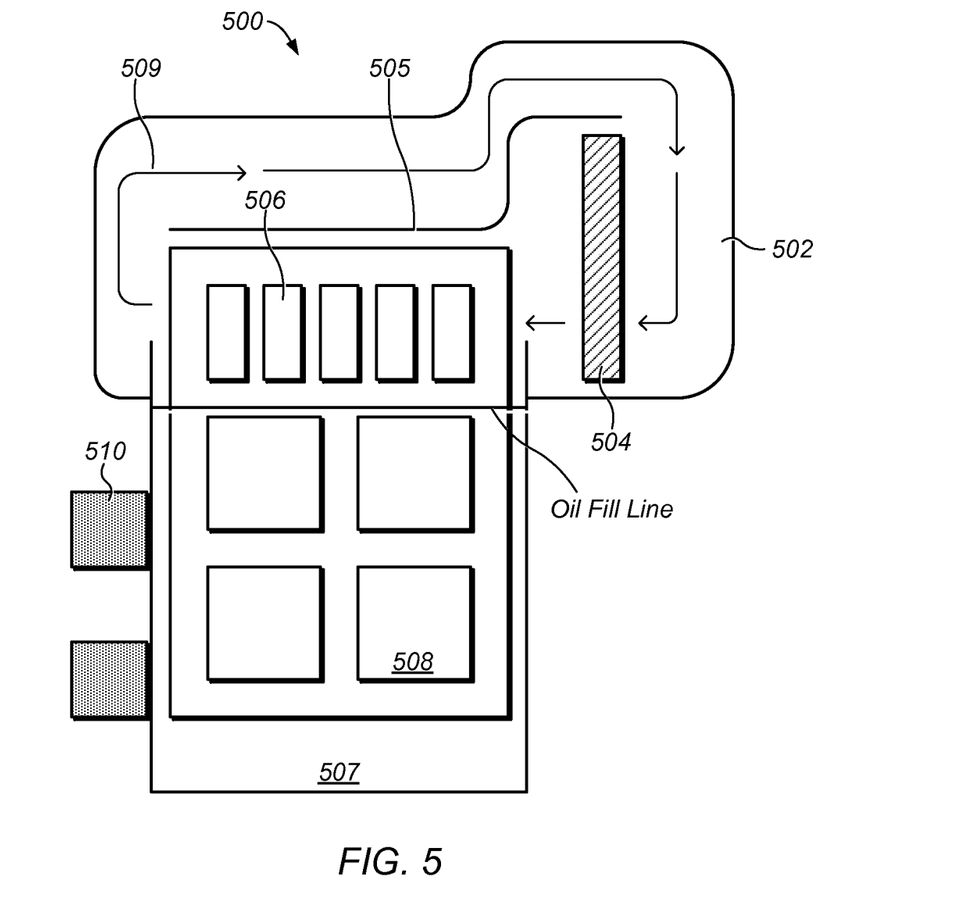
FIG. 5 illustrates an embodiment that utilizes a closed loop air cooling scheme.

FIG. 5 illustrates an embodiment of cooling apparatus 500. Tank 507 holds motherboards 508 submerged in liquid coolant held by tank 507. Disk drives 506 are held above the liquid coolant. Fan 504 directs air flow 509 over the disk drives 506 in closed loop 502. Ducting 505 helps direct air flow 509 towards the disk drives 506. In the absence of ducting 505 air blown by fan 504 may circulate very inefficiently and largely bypass the vicinity of disk drives 506 if they are closely spaced together due to the greater resistance to air flow. In some embodiments cable trays 510 are attached to the tank 507.

Closed loop 502 may be contained in a single node, a single rack, a plurality of racks, a room in a datacenter, or even an entire datacenter. In certain embodiments the loop is open and air is simply drawn in by the fan. For example, the fan may draw in air from the room the cooling apparatus is located in and heated air is exhausted back into the room.

Figure 6:
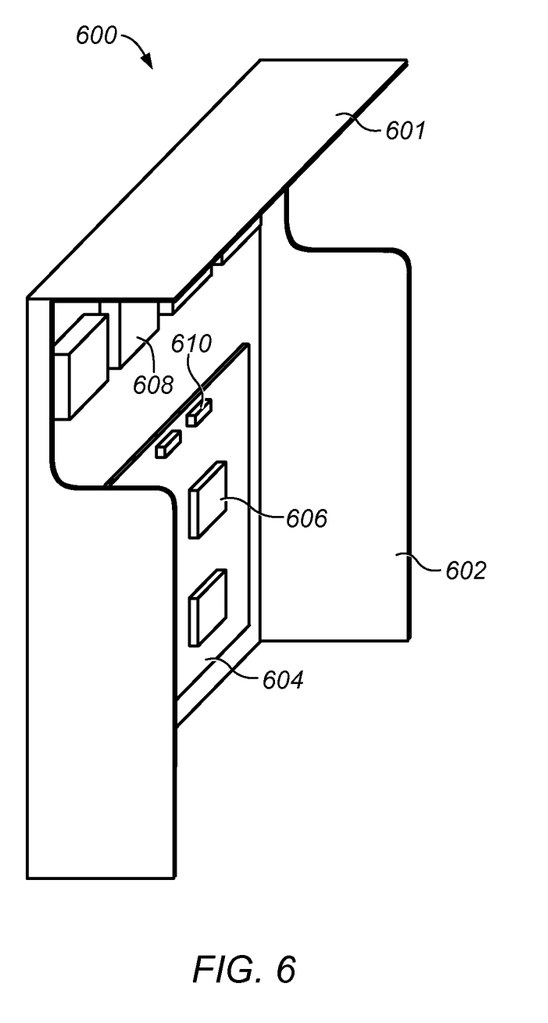
FIG. 6 illustrates a chassis associated with a node, including a lip for protecting disk drives from dripping coolant that may originate from components of other nodes being removed for service or replacement.

FIG. 6 illustrates several aspects of cooling apparatus 600, including a lip 601 that shields the disk drives 608 mounted in the caddy from dripping oil. Connectors 610 communicatively couple the disk drives 608 with processing units 606 on motherboard 604 mounted to plate 602. Plate 602 and lip 601 may be made of a single piece of material or may constitute a plurality of pieces attached together.

In some embodiments, a temperature of a liquid coolant may be monitored and/or controlled. Methods of monitoring and controlling temperature of the oil may be as described in the '579 Publication.

In some embodiments, flow through the servers in augmented using augmentation, such as nozzles, fans, or pumps. A separate augmentation device may be included on each node, every other node, each row of nodes, or other frequency. The '579 Publication describes apparatus and methods using augmentation devices in various embodiments.

In some embodiments, liquid coolant may be removed through the top of the rack. Liquid coolant may be reintroduced after having been cooled (for example, by passing the liquid coolant through a heat exchanger outside of the rack. The '579 Publication describes apparatus and methods for removing liquid coolant from the top of a rack in various embodiments.

In various embodiments described herein, computing modules are shown as having four racks. Computing modules may nevertheless in various embodiments have any number of racks. In one embodiment, a computing module has one rack.

In various embodiments described herein, a system has been described as holding motherboard assemblies in a submersed or partially submersed condition. A system may nevertheless in various embodiments hold other types of circuit board assemblies or components in a partially submersed condition.

As used herein, the terms "or" is intended to cover a non-exclusive inclusion. That is, "or" includes both meanings of both "or" and "and/or."

The terminology used herein is for the purpose of describing particular embodiments only and is not intended to be limiting of the invention. As used herein, the singular forms "a", "an" and "the" are intended to include the plural forms as well, unless the context clearly indicates otherwise.

As used herein, the term "data processing module" generally refers to one or more computing devices running software configured to receive requests, typically over a network. A data processing module may include one or more servers connected to a network and running software configured to receive requests from other computing devices on the network, which may include other servers, and desktop and mobile computing devices, including cellular phones. Such data processing modules typically include one or more processors, memory, input/output connections to a network and other electronic components, and may include specialized computing devices such as blade servers, network routers, data acquisition equipment, and other devices commonly associated with data centers.

As used herein, the term "disk drive" refers to a data storage device. While the term drives with a rigid metal disk coated with a magnetic material on which data for a computer can be stored, it also encompasses other storage technologies, such as flash-based solid state drives. A disk drive may be operable when submerged in a liquid or not. A disk drive may be sealed or unsealed. Unsealed versions are designed to allow the surrounding air to enter the disk drive, so those drives with internal components that are sensitive to liquids are unsuited to operating in a cooling liquid as the liquid would leak into the drive. When used as a plural, "disk drives" may refer to a heterogeneous collection of drives, some operable in liquid and others not, or it may refer to a homogenous collection of drives, wherein all drives are operable in liquid or not. Additionally, a plurality of disk drives may be operated together as a single array. A disk drive may be communicatively connected to one or more processing units. A disk drive may serve multiple nodes, as may an array of disk drives. Multiple disk drives may be grouped together into a single logical disk drive.

As used herein, the term "caddy" refers to a casing designed to hold one or more disk drives. Typically caddies are easy to install and remove, so they facilitate the easy servicing and replacement of disk drives.

As used herein, the term "node" generally refers to a computing device that can be configured to receive and respond to requests to perform computing operations. A node may have one processor or multiple processors. A node may contain one or more motherboards. In some embodiments, a node includes one or more servers and/or one or more data processing modules.

As used herein, the term "tank" generally refers to a container with or without a lid, containing a liquid coolant into which one or more data processing modules may be installed.

As used herein, an "independently operable" device means capable of usefully functioning without regard to an operational status of an adjacent device. As used herein, an "independently operable data processing module" means a data processing module that is capable of usefully functioning to provide data processing services and without regard to an operational status of an adjacent data processing module. Operation of independently operable data processing modules can be influenced (e.g., heated) by one or more adjacent data processing modules, but as used herein, an independently operable data processing module generally functions regardless of whether an adjacent data processing module operates or is operable.

As used herein, the term "liquid coolant" mean any sufficiently nonconductive liquid such that electrical components (e.g., a motherboard, a memory board, and other electrical or electronic components designed for use in air) continue to reliably function while submerged without significant modification. A suitable liquid coolant is a dielectric liquid coolant, including without limitation vegetable oil, mineral oil, transformer oil, or any liquid coolant have similar features (e.g., a non-flammable, non-toxic liquid with dielectric strength better than or nearly as comparable as air).

As used herein, "fluid" means either a liquid or a gas, and "cooling fluid" means a gas or liquid coolant typically used for heat-rejection or cooling purposes. As used herein, a liquid coolant is a subset of the universe of cooling fluids, but a cooling fluid may be a dielectric or non-dielectric liquid or gas, such as, for example, a conventional air conditioning refrigerant.

As used herein, "circulate" means to cause a substance to go or spread from one place to another. As used herein, circulating does not require that the substance follow a course that returns to the starting point, or otherwise form a closed loop. In certain embodiments, however, a hard drive cooling fluid may circulate in a closed loop. For example, air that has received heat from heat producing components in a rack may be cooled via a heat exchanger and then recirculated back through a rack enclosure.

As used herein, "integrate" means to make something a part of another thing.

As used herein, "ducting" means a pipe, tube, channel or other structure that conveys or directs the flow of a substance. The ducting itself need not form a closed chamber. For example, in a disclosed embodiment, a lid that seals the top of a rack and helps to direct the flow of air to a particular location by blocking its escape through the top of the rack constitutes a form of ducting as the term is used herein.

As used herein, "heat" refers to thermal energy. When used in reference to the thermal energy of a substance, it may include all or only part of the thermal energy of that substance. For example, when a heat exchanger transfers heat from air to a liquid, as used in this disclosure such a description does not require that all of the air's thermal energy be transferred to the liquid, just that some thermal energy be transferred.

As used herein, "heat producing components" means electronic components that generate a portion of a system's overall heat output. Examples include processing cores, ASICs, DSPs, memory controllers, and power supplies.

As used herein, "heat exchanger" refers to a device designed to transfer heat between two physically separated fluids, wherein fluid refers to any substance that is able to flow, such as a liquid, gas, or plasma.

As used herein, "closed loop" refers to a system that does not exchange mass with other systems, for example, a quantity of air in a sealed container that is not exchanged with air outside the container. As used in reference to "closed loop," system is meant in the broadest physical sense and is not meant to imply a computer system, though in this disclosure in some instances the system that defines a closed loop may indeed also constitute a computer system.

The flowchart and block diagrams in the drawings illustrate the architecture, functionality, and operation of possible implementations of systems, methods and program products, according to various embodiments of the present invention.

While this specification contains many specifics, these should not be construed as limitations on the scope of the invention or of what can be claimed, but rather as descriptions of features specific to particular implementations of the invention. Certain features that are described in this specification in the context of separate implementations can also be implemented in combination in a single implementation. Conversely, various features that are described in the context of a single implementation can also be implemented in multiple implementations separately or in any suitable sub combination. Moreover, although features can be described above as acting in certain combinations and even initially claimed as such, one or more features from a claimed combination can in some cases be excised from the combination, and the claimed combination can be directed to a sub combination or variation of a sub combination.

Similarly, the separation of various system components in the implementations described above should not be understood as requiring such separation in all implementations, and it should be understood that the described program components and systems can generally be integrated together in a single software product or packaged into multiple software products.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Methods may be implemented manually, in software, in hardware, or a combination thereof. The order of any method may be changed, and various elements may be added, reordered, combined, omitted, modified, etc. Changes may be made in the elements described herein without departing from the spirit and scope of the invention as described in the following claims.

What is claimed is:

1. A computing system, comprising:
    a rack comprising a container configured to hold liquid coolant;
    liquid coolant in the container, wherein the liquid coolant is a dielectric fluid;
    one or more nodes mounted in the rack, wherein each of at least one node comprises a frame, one or more motherboard assemblies coupled to the frame, and one or more disk drives, wherein the rack is configured to hold the nodes partially submersed in the liquid coolant such that heat producing components on the one or more motherboard assemblies are submersed in the liquid coolant, wherein at least one of the one or more disk drives is an exposed disk drive substantially above the surface of the liquid coolant; and one or more fans configured to direct a circulating air to an exposed portion of at least one the of the exposed disk drives.

2. The computing system of claim 1, wherein at least one of the one or more nodes is mounted vertically in the rack such that it can be removed from the liquid coolant without disturbing any adjacent nodes.

3. The computing system of claim 1, wherein there are two or more disk drives and at least one disk drive is submerged in the liquid coolant.

4. The computing system of claim 1, wherein for a given node, the exposed disk drive is mounted directly to the frame and the frame is configured to hold the exposed disk drive above the surface of the liquid coolant.

5. The computing system of claim 1, further including a caddy, wherein for a given node,
the exposed disk drives is mounted to the caddy,
the caddy is configured to hold the exposed disk drives above the surface of the liquid coolant, and
the caddy is connected to the frame.

6. The computing system of claim 1, farther including a control circuit, wherein the control circuit monitors One or more variables, comprising one or more of:
variables relating to disk drive health, speed of the one or more fans, a fan voltage, temperature of one or more of the disk drives, temperature of the circulating air, or temperature of the liquid coolant,
wherein the control circuit is configured to vary the speed of at least one of the one or more fans based upon at least one of the one or more variables.

7. The computing system of claim 1, further including a ducting configured to ensure that a substantial majority of the circulating air passes over a surface of the exposed disk drive.

8. The computing system of claim 1, wherein the one or more fans is mounted to at least one of the one or more nodes.

9. The computing system of claim 1, wherein the one or more fans is mounted to the rack.

10. The computing system of claim 1, wherein the circulating air is drawn from the environment surrounding the rack.

11. The computing system of claim 1, wherein the circulating air transfers heat to the cooling liquid.

12. The computing system of claim 1, wherein the rack is sealed and the circulating air forms a closed loop within the rack.

13. The computing system of claim 1, further including a first heat exchanger configured to remove heat from the circulating air.

14. The computing system of claim 13, wherein the first heat exchanger is configured to transfer heat to the cooling liquid.

15. The computing system of claim 13, wherein the first heat exchanger is configured to transfer heat to a first liquid, the first liquid is circulated to an area external to the rack, and the first liquid transfers heat to the area external to the rack.

16. The computing system of claim 7, wherein the ducting directs a flow of air towards the one or more disk drives.

17. The computing system of claim 15, further including a second heat exchanger, wherein the liquid coolant transfers heat to the second heat exchanger and the second beat exchanger transfers heat to the first liquid.

18. A method of cooling rack-mounted nodes, comprising:
mounting one or more rack-mounted nodes in a container such that a portion of the nodes are submersed in a cooling liquid and at least a portion of at least one of the nodes is exposed above the surface of the cooling liquid;
moving at least a portion of the cooling liquid to cool submersed heat producing components of the nodes; and
moving air with one or more fans above the surface of the cooling liquid in the container to cool exposed heat producing components of the nodes.

19. The method of claim 18, wherein each rack-mounted node comprises a frame, one or more motherboard assemblies coupled to the frame, and one or more disk drives.

20. The method of claim 18, wherein at least one of the rack-mounted nodes is mounted vertically in the rack such that it can be removed from the liquid coolant without disturbing any adjacent nodes.

21. The method of claim 18, wherein there are two or more disk drives and at least one disk drive is submerged in the liquid coolant.

22. The method of claim 18, further comprising using a control circuit to monitor one or more variables, comprising one or more of:
variables relating to disk drive health, speed of the one or more fans, a fan voltage, temperature of one or more of the disk drives, temperature of the circulating air or temperature of the liquid coolant,
wherein the control circuit is configured to vary the speed of at least one of the one or more fans based upon at least one of the one or more variables.

23. The method of claim 19, further comprising using ducting configured to ensure that a substantial majority of the circulating air passes over a surface of an exposed disk drive.

24. The method of claim 18, wherein the air transfers heat to the cooling liquid.

* * * * *